(12) United States Patent
Hembree

(10) Patent No.: US 6,459,286 B2
(45) Date of Patent: *Oct. 1, 2002

(54) TEST HEAD ASSEMBLY UTILIZING REPLACEABLE SILICON CONTACT

(75) Inventor: David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/842,686

(22) Filed: Apr. 27, 2001

Related U.S. Application Data

(63) Continuation of application No. 09/386,320, filed on Aug. 31, 1999, now Pat. No. 6,246,246.

(51) Int. Cl.$^7$ .............................................. G01R 31/02
(52) U.S. Cl. ........................................................ 324/754
(58) Field of Search ........................... 439/71, 526, 482; 324/537, 754, 755, 765, 761; 438/15, 17

(56) References Cited

U.S. PATENT DOCUMENTS

| | | | |
|---|---|---|---|
| 4,764,925 A | 8/1988 | Grimes et al. | |
| 5,640,762 A | 6/1997 | Farnworth et al. | |
| 5,713,744 A | * 2/1998 | Laub | 439/71 |
| 5,716,218 A | 2/1998 | Farnworth et al. | |
| 5,730,620 A | * 3/1998 | Chan et al. | 439/526 |
| 5,742,481 A | * 4/1998 | Murphy et al. | 361/767 |
| 5,823,818 A | 10/1998 | Bell et al. | |
| 5,847,293 A | 12/1998 | Elmer | |
| 5,875,198 A | 2/1999 | Satoh | |
| 5,878,485 A | 3/1999 | Wood et al. | |
| 6,307,394 B1 | * 10/2001 | Farnworth et al. | 324/765 |

* cited by examiner

*Primary Examiner*—N. Le
*Assistant Examiner*—Etienne P LeRoux
(74) *Attorney, Agent, or Firm*—Dickstein Shapiro Morin & Oshinsky LLP

(57) ABSTRACT

A method and apparatus for testing semiconductor devices is described. The apparatus includes a base having a pair of cavities with openings and a nested structure which fits within each cavity. The nested structure includes a fixture having an opening for insertion of a device under test (DUT) therein and a silicon substrate having electrical contacts which are held in the cavity by the future. Upper and lower pin blocks, which allow pins to extend through, fit within the cavity openings and connect with contacts of the silicon substrate, and in turn to a DUT.

22 Claims, 13 Drawing Sheets

TEST HEAD ASSEMBLY UTILIZING REPLACEABLE SILICON CONTACT

This application is a continuation of U.S. application Ser. No. 09/386,320, filed Aug. 31, 1999, now U.S. Pat. No. 6,246,246.

FIELD OF THE INVENTION

The present invention relates to the testing of semiconductor chips, particularly chip-sized packages (CSP). More particularly, the invention relates to a test head assembly which obviates the requirement of contacting a device-under-test (DUT) by way of pogo pins or other conventional devices.

BACKGROUND OF THE INVENTION

The testing of semiconductor chips is well known. Some conventional testing apparatus for semiconductor devices, such as CSPs, provide for an electrical contact between the device and a printed circuit board (PCB). The electrical contact is generally made through spring-loaded test probes or through pins extending through an intermediate section of a carrier. An example of spring-loaded test probes may be found in U.S. Pat. No. 5,823,818 (Bell et al.). Examples of the use of contact test pins may be found in U.S. Pat. No. 4,764,925 (Grimes et al.) and U.S. Pat. No. 5,875,198 (Satoh).

One potential deficiency in utilizing spring-loaded test probes, also known as pogo pins, or stationary pins, is the difficulty in properly attaching them to the DUTs. With the increasingly smaller device sizes, the electrical contacts are getting closer together, making the manufacture of the test device itself, with pogo pins or stationary pins, and the subsequent testing of the contacts with such a device even more difficult.

SUMMARY OF THE INVENTION

The present invention provides an apparatus for testing semiconductor devices including a base, an intermediate silicon contact structure supported by the base and having a plurality of electrical contacts for mating with the contacts of a DUT and which supplies signals between the DUT and a testing apparatus, and a fixing structure. The fixing structure holds the intermediate silicon contact structure to the base. The fixing structure has an opening through which a DUT may pass and be connected with the plurality of electrical contacts of the intermediate structure.

The present invention also provides a system for testing semiconductor devices. The system has a testing apparatus, which includes a base having at least one cavity with an opening extending from a cavity surface to a bottom surface of the base, an intermediate silicon contact structure supported by the base within one of the cavities and having a plurality of electrical contacts adapted to provide an electrical connection between the printed circuit board and a DUT, and a fixing structure which holds the intermediate structure to the base. The fixing structure has an opening through which a DUT may pass and be connected with the plurality of electrical contacts of the intermediate structure. The system further includes a printed circuit board positionable on the cavity surface which is electrically connected with the intermediate structure and with a testing apparatus, and a pick and place device for moving a DUT into electrical connection with the intermediate structure.

The present invention also provides a method for testing a semiconductor device. The method includes the steps of moving a semiconductor device into a semiconductor test apparatus, electrically connecting the semiconductor device to a testing apparatus through the intermediate silicon contact structure, and testing the semiconductor device with the testing apparatus.

These and other features and advantages of the invention will be more clearly understood from the following detailed description of the invention which is provided in connection with the accompanying drawings.

DETAILED DESCRIPTION OF THE PREFERRED EMBODIMENTS

Figure 1:
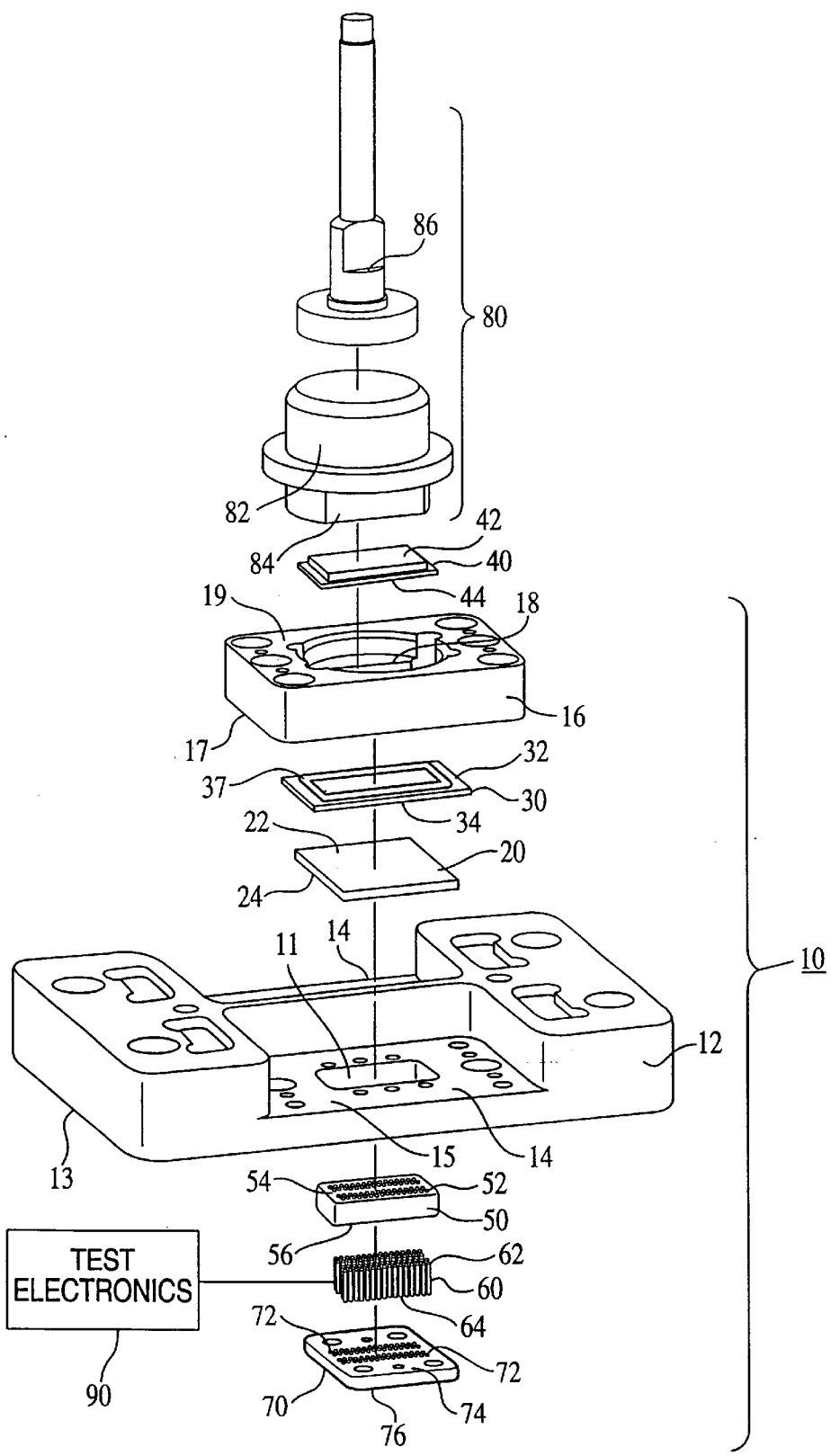
FIG. 1 is an exploded perspective view of a test head assembly constructed in accordance with an embodiment of the present invention.

The present invention alleviates, at least to some extent, the deficiencies of conventional test probe apparatuses by providing an intermediate silicon contact structure in the test probe apparatus which acts as an electrical conduit between the electrical contacts of a chip-size package and those of a printed circuit board (PCB). The intermediate structure has finely spaced contacts which can be easily sized and configured to mate with the electrical contacts of a DUT and also connects with contact terminals of the PCB, which in turn connect with a testing apparatus.

FIGS. 1–10 illustrate an embodiment of the invention. It should be noted that the invention will be described in the exemplary environment of a test apparatus in which two packaged chips can be tested at the same time. However, the invention can be used to test one, two or more than two packaged chips simultaneously. Accordingly, the discussion herein is not to be considered as a limitation of the invention.

A contactor test head 10 is shown including a base 12 and a holding fixture 16. The base 12 includes a pair of cavities 14, each having a cavity surface 15. An opening 11 extends through the cavities 14 from the cavity surfaces 15 to a base lower surface 13. Each cavity 14 has an associated holding fixture 16, silicon contact structure 30, printed circuit board 20, first pin block 70, pin assembly 60 and second pin block 50.

The holding fixture 16 is sized and configured to sit within each cavity 14 of the base 12. Each holding fixture 16 includes an opening 18 extending from an upper surface 19 to a lower surface 17. The holding fixture 16 should be made of a non-conductive material which is stable at high temperatures and resists wear over time. Further, the holding fixture 16 should be formed of a high strength material. An example of a suitable material for the holding fixture 16 is a glass-filled plastic, such as, for example, Torlon® 5533, Torlon® 4203, Torlon®4203L, Torlon® 4301, or Peek®.

The holding fixture 16 is secured to the base 12 by screws or other fasteners and serves to hold a silicon contact structure 30 and an associated printed circuit board (PCB) 20 in nested relationship to a respective cavity 14 in the base 12. As noted) while the invention is described with reference to a device for testing two DUTs at a time, the invention may be adapted to test any number of DUTs simultaneously.

Figure 2:
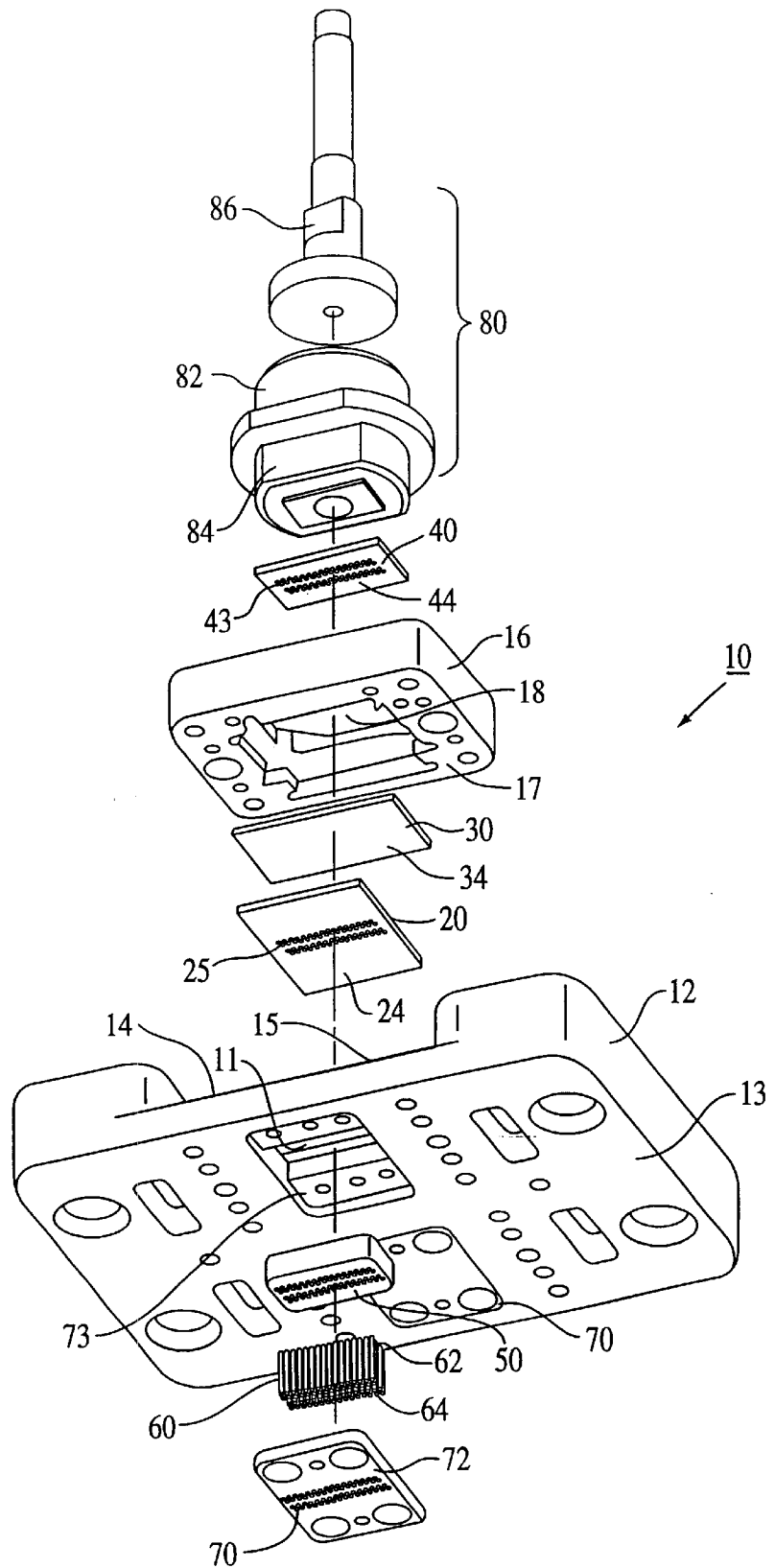
FIG. 2 is another exploded perspective view of the test head assembly of FIG.

With specific reference to FIGS. 1–2, a first pin block 70 having a first surface 74 and a second surface 76 sits within an opening 11 of each of the cavities in the base 12 such that a first surface 74 of the first pin block 70 fits against a cavity ledge 73 (FIG. 2). The first pin block 70 further includes a plurality of openings 72 for receiving a plurality of pins 60.

A second pin block 50, having a plurality of openings 52, a first surface 54, and a second surface 56, further fits within each opening 11. The first and second pin blocks 70, 50 serve to hold the plurality of pins 60 within the openings 11. Obviously, as there are two cavities 14 in the illustrated base 12, each cavity 14 may receive a first and second pin block 70, 50. Further, it is to be understood that the base 12 may be altered to receive more than two sets of pin blocks 70, 50.

Figure 7:
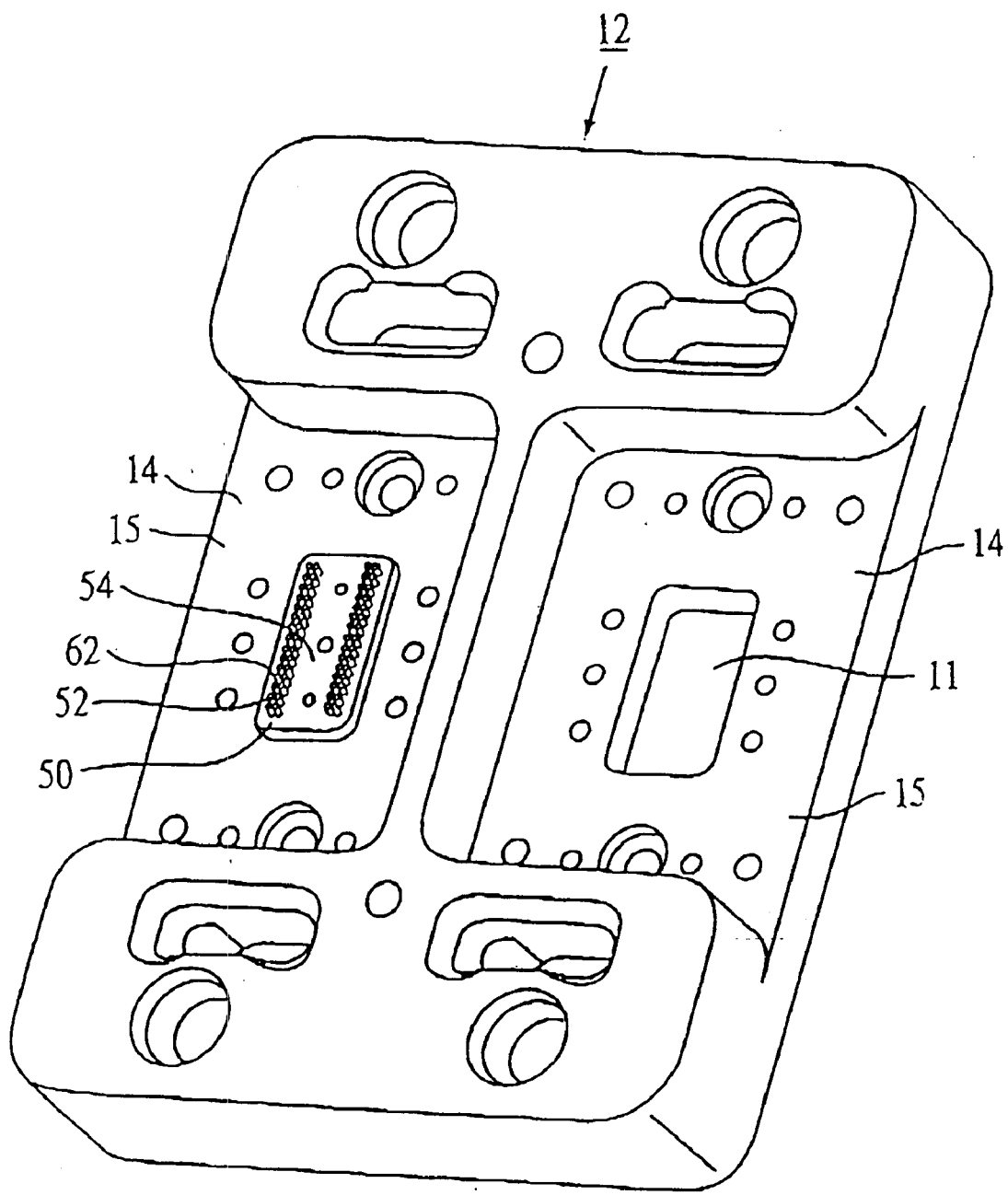
FIG. 7 is a perspective view of the test head base showing an upper pin block in the test head assembly of FIG. 1.
Figure 8:
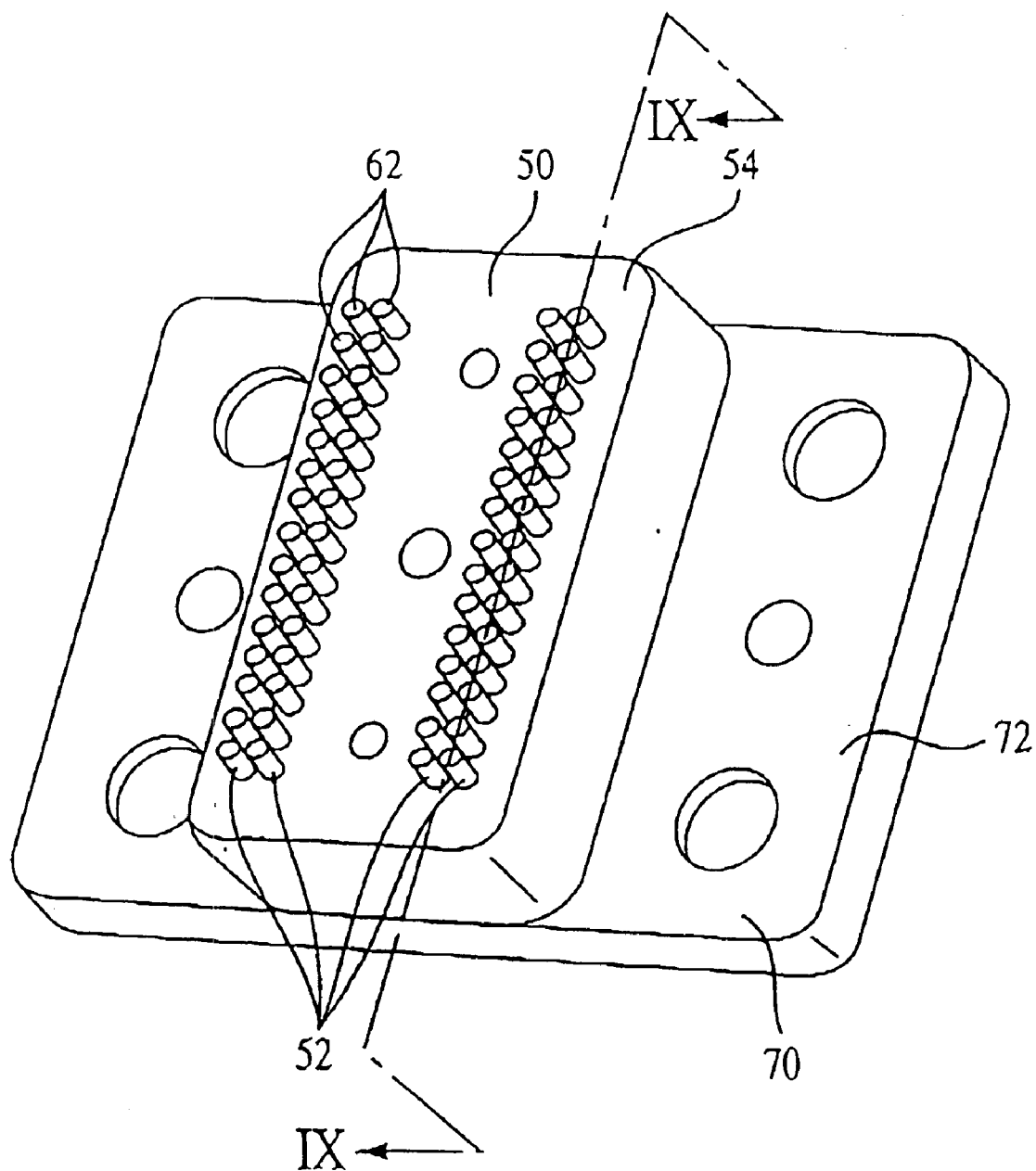
FIG. 8 is a perspective view of the upper pin block and lower pin block of the test head assembly of FIG. 1

The plurality of pins 60, which may be pogo pins or stationary pins, fit within the first and second pin blocks 70, 50. Specifically, top portions 62 of the pins 60 fit within the openings 52 of the second pin block 50. Further, bottom portions 64 of the pins 60 fit within the plurality of openings 72 in the first pin block 70. Thus, the pins 60 extend through the first pin block 70 to a testing apparatus and up through the second pin block 50 and into the respective cavities 14 of the base 12 (FIGS. 7–9).

Figure 9:
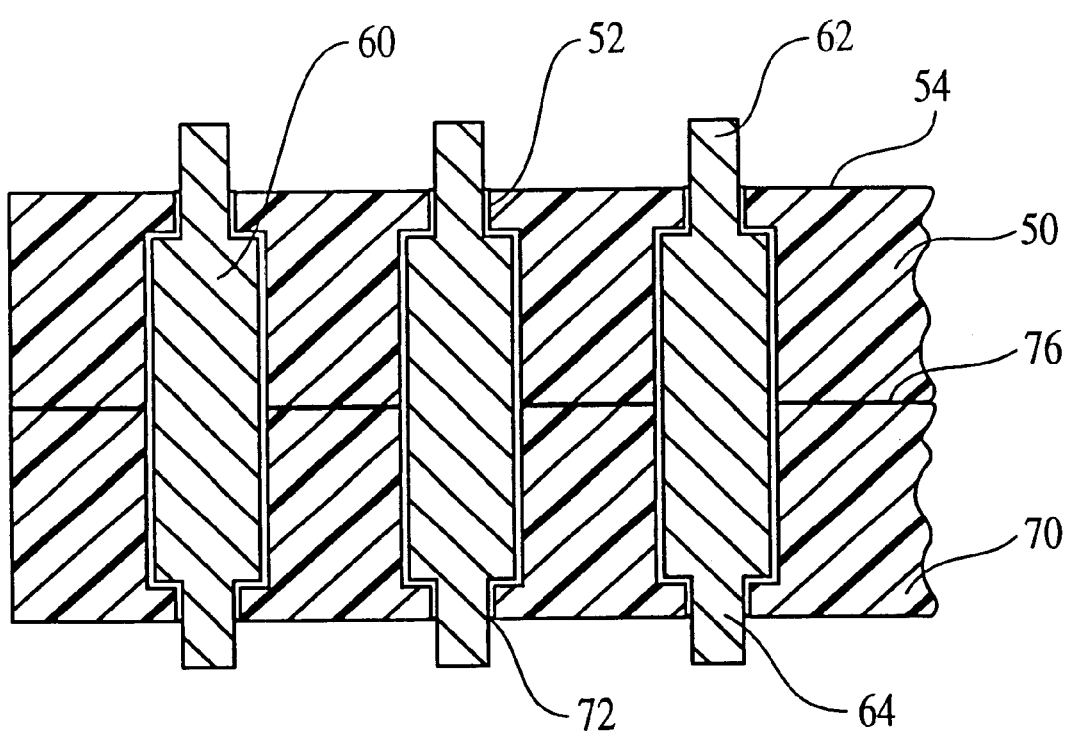
FIG. 9 is a cross-sectional view taken along line IX—IX of the pin blocks of FIG. 8.

The openings 52 are counter-bored beneath the first surface 54 of the pin block 50, and the openings 72 are counter-bored in the second surface 76 of the pin block 70 to accept a non-movable body portion of the pin 60 (FIG. 9). The portions of the openings 52, 72 which are not counter-bored have a diameter sized and shaped so as to securely hold the pins 60 therein.

Figure 10:
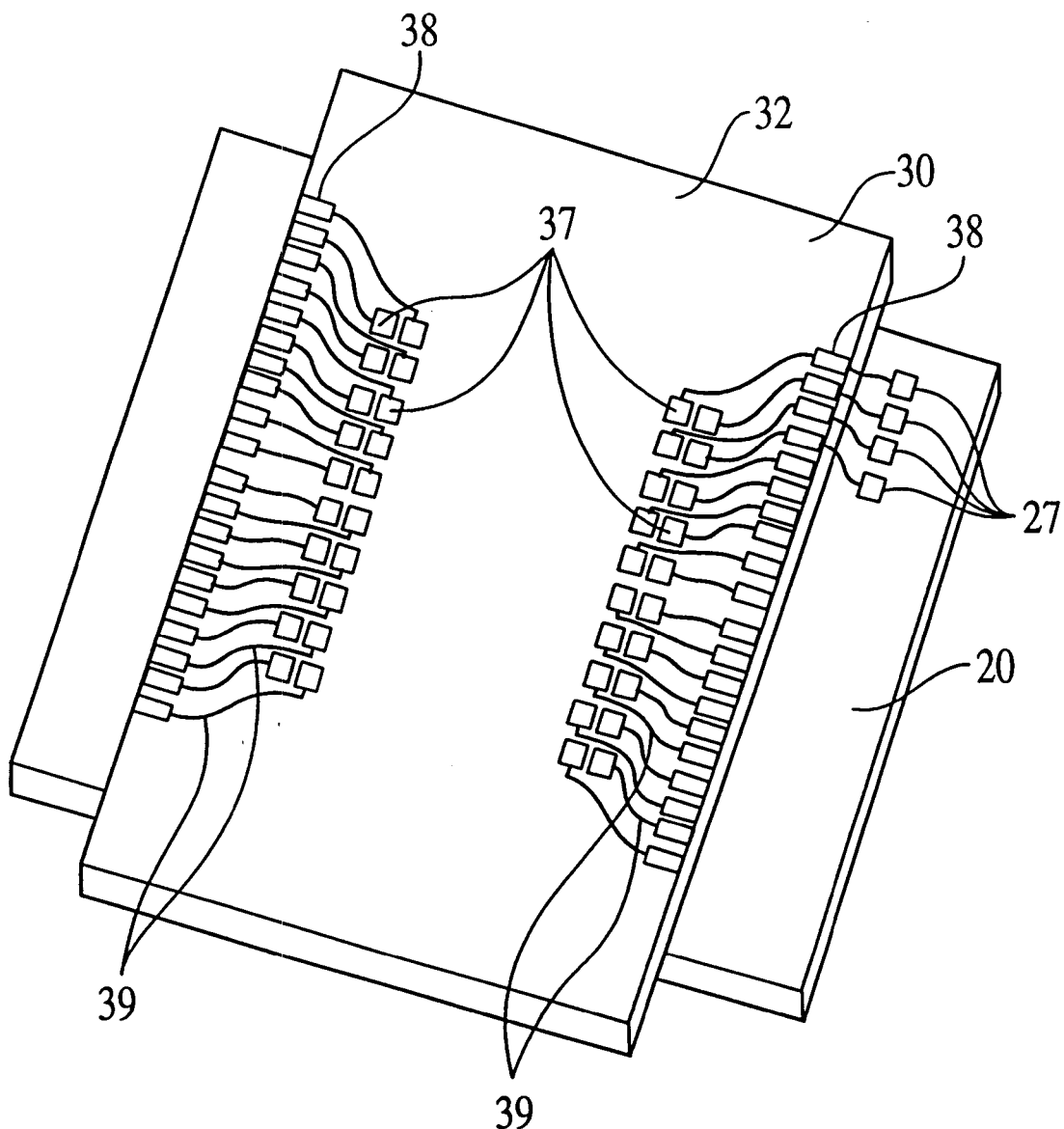
FIG. 10 is a perspective view of the silicon contactor and the printed circuit board substrate of the test head assembly of FIG. 1.

With reference to FIGS. 1–2 and 10, the printed circuit board (PCB) substrate 20, having a first surface 22 and a second surface 24 is positioned within the cavity 14 of the base 12. Specifically, the second surface 24 of the PCB substrate 20 is placed in contact with the plurality of top portions 62 of the pins 60. The top portions 62 of the pins make contact with respective electrical contact points 25 on the second surface 24 of the PCB substrate 20. The electrical contact points 25 are in turn connected to a wiring pattern on the PCB substrate 20 which connects respective contact points 25 on the second surface 24 to electrical connections 27 on the first surface 22 of the PCB substrate 20 (FIGS. 6, 10).

Figure 5:
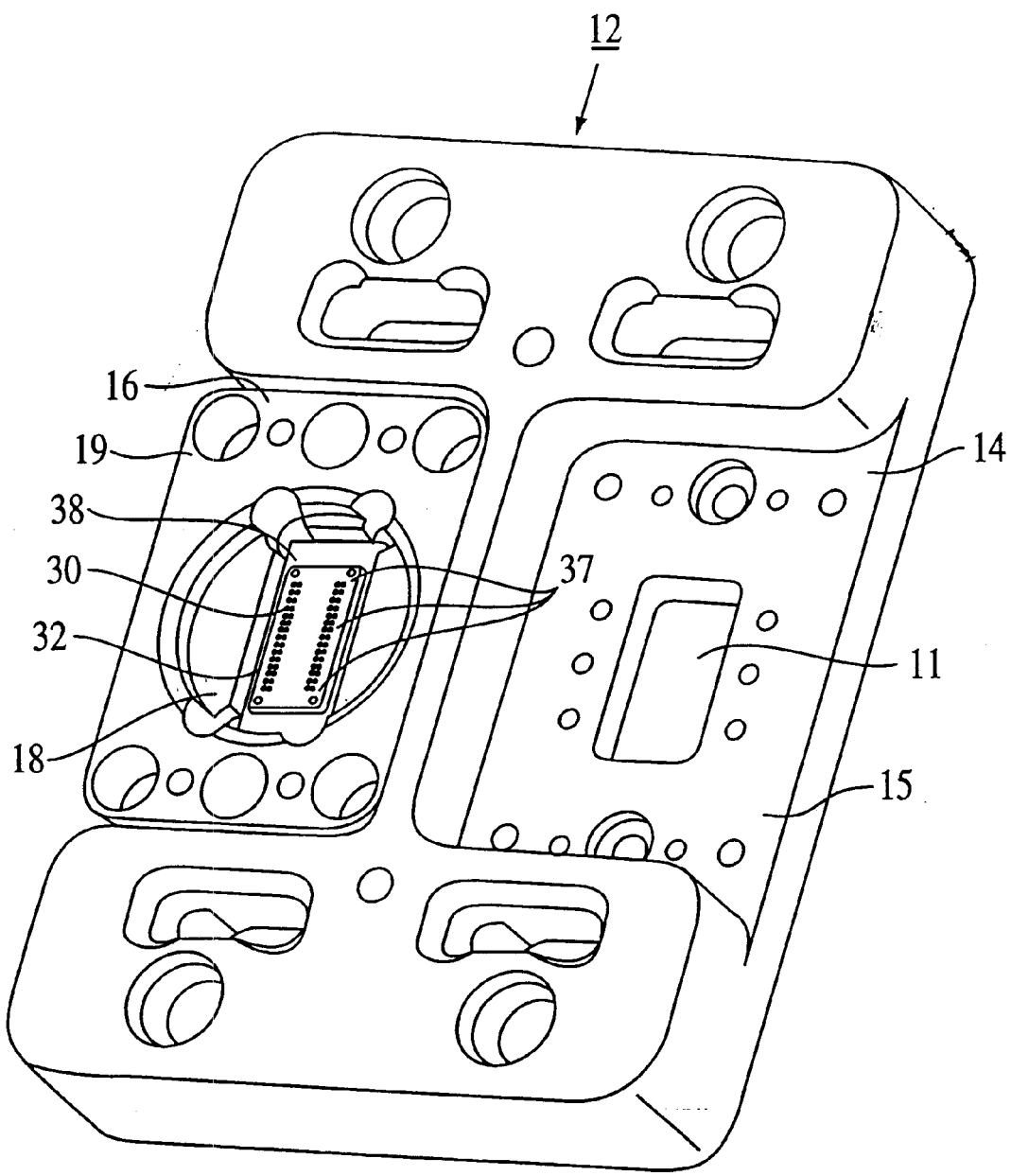
FIG 5 is a perspective view of the test head base showing a silicon contactor in the nest of the test head assembly of FIG. 1.
Figure 6:
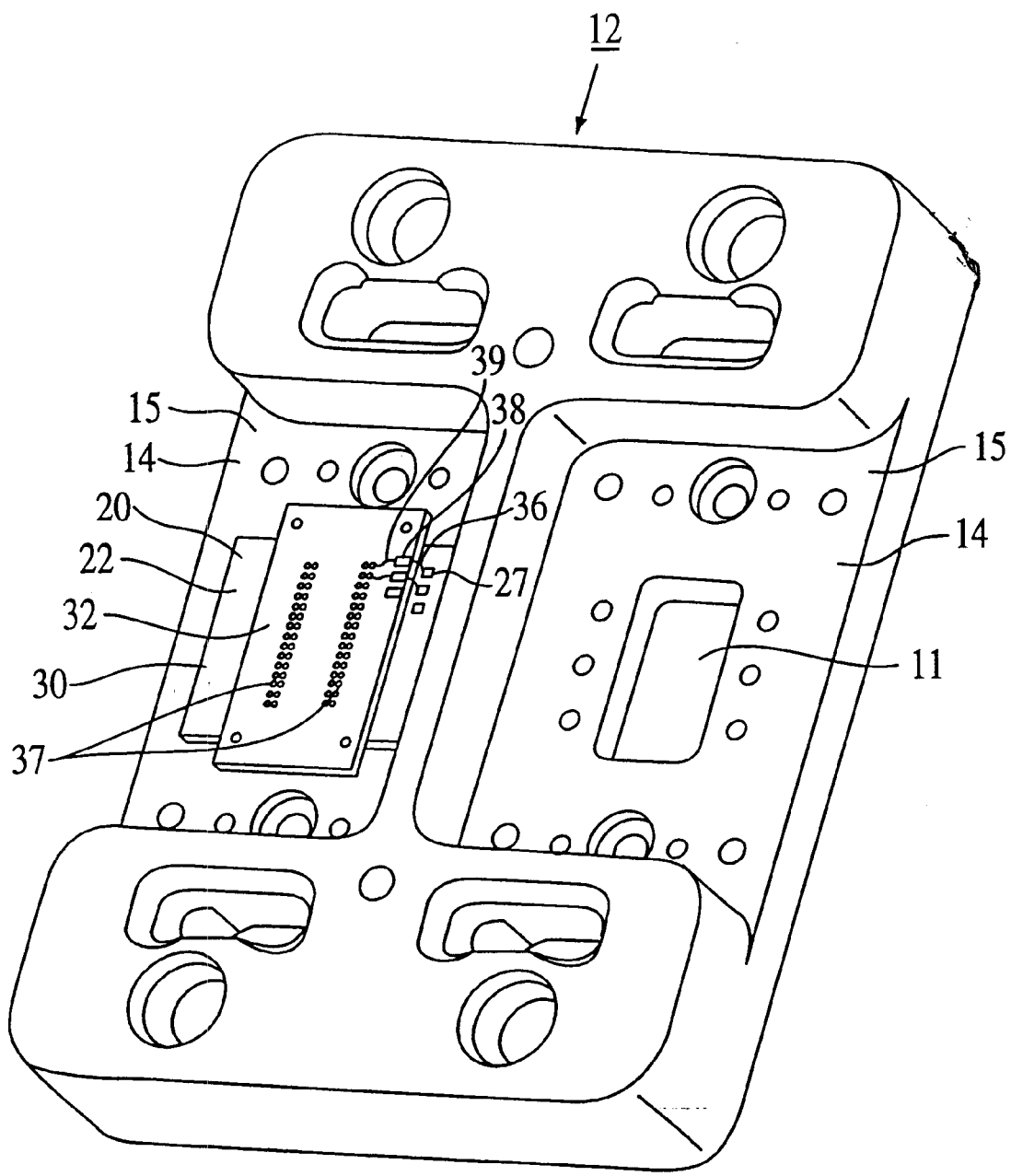
FIG. 6 is a perspective view of the test head base showing a printed circuit board substrate and a silicon contactor in the test head assembly of FIG. 1.

With specific reference to FIGS. 5–6 and 10, there is shown a silicon contact structure 30 having a top surface 32 and a bottom surface 34. A plurality of electrical contacts 37 are arrayed along two sides of the top surface 32 of the contact structure 30, the number and pattern of contacts 37 being tailored to a specific DUT or types of DUTs. The contacts 37 may be pockets formed in an insulator material and having a thin film conductor, such as tungsten. A thin film trace 39 extends from each electrical contact 37 to a respective contact pad 38. Each pad 38 may be formed of a flat conductor. The thin film traces 39 fan out from the electrical contacts 37 to the pads 38. Each pad 38 has a wire bond 36 to a respective electrical connection 27 on the top surface 22 of the printed circuit board 20. For clarity of illustration in FIG. 6, only a few of the wire bonds 36 between the pads 38 and connections 27 are shown.

Figure 4:
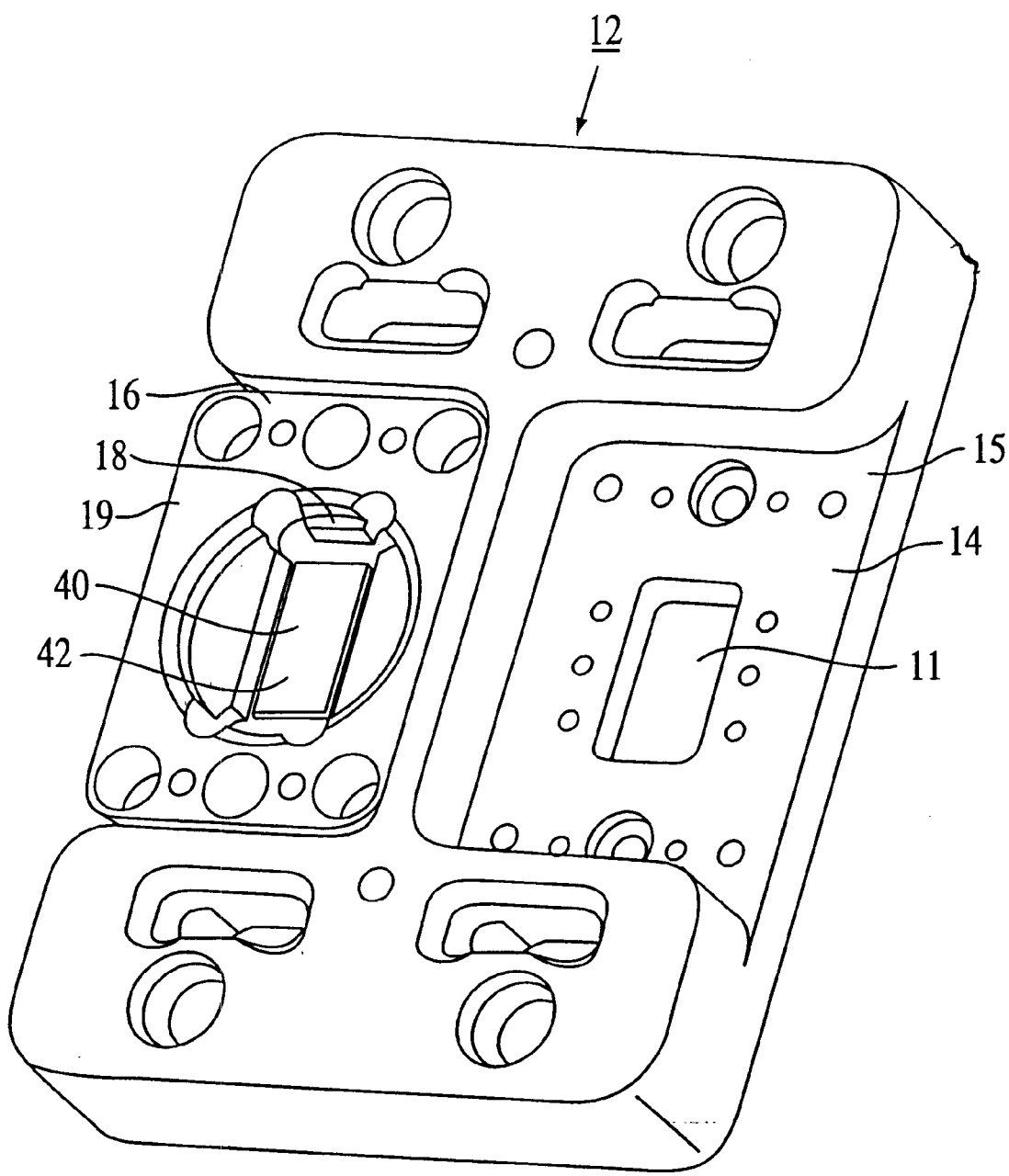
FIG. 4 is a perspective view of the test head base showing a chip sized package in the test head assembly of FIG. 1.

FIGS. 1–2 and 4 show a chip-size package 40 having a top surface 42 and a bottom surface 44. The bottom surface 44 is placed in direct contact with the contacts 37 on the first surface 32 of the silicon contact structure 30. The chip-size package 40 further includes electrical contacts.43 (FIG. 2) which are electrically connected to the electrical contacts 37 of the silicon contact structure 30. The contacts 43 may be solder balls. The electrical contacts 37 of the silicon contact structure 30 are spaced to align with the contacts 43 of the chip-size package (DUT) 40. The electrical contacts 37 may therefore be closely spaced, in accordance with the close spacing of the contacts 43 of the DUT 40, while still providing good electrical contact between a testing apparatus connected to the PCB 20 through the pins 60 and the DUT 40. In addition, different contact structures 30 can easily be produced for different sizes and types of DUTs.

Figure 3:
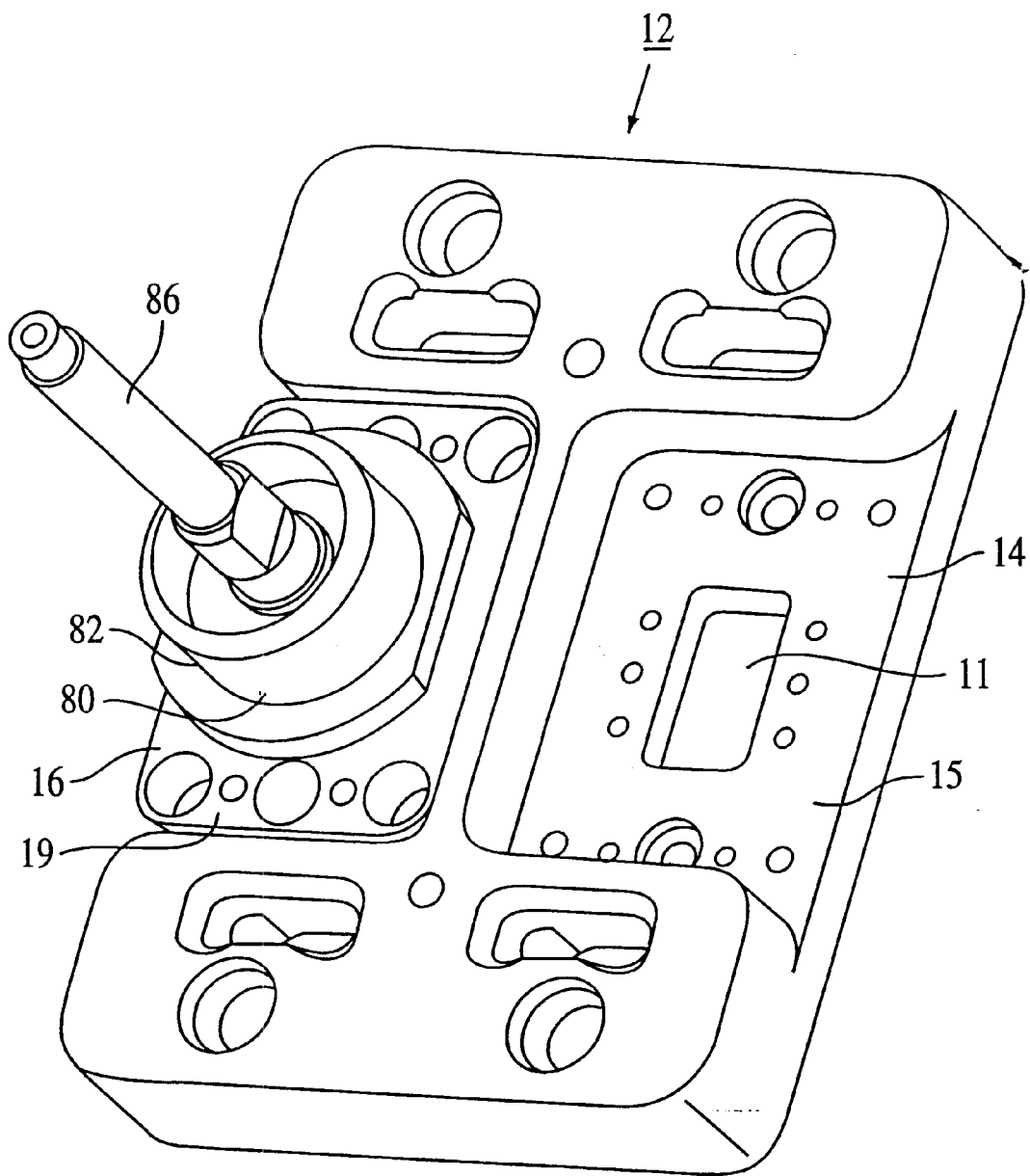
FIG. 3 is a perspective view of the test head base and pick and place device of the test head assembly of FIG 1.

To test the chip-size package 40, it is placed within the opening 18 of the holding fixture 16 by way of a pick and place device 80 (FIG. 1–3). The pick and place device 80 includes a vacuum head 82 with an extension 84 and a vacuum quill 86. A vacuum is drawn through the head 82 and the quill 86, which creates a suction force on the chip-sized package 40. In this way, the pick and place device 80, moved by a robot, can pick up a package 40 from a tray containing a plurality of packages 40 and place the package 40 within the opening 18 of the holding fixture 16. Once properly placed, the vacuum may be disconnected from the vacuum device 80, thereby eliminating the vacuum force on the package 40. A pressure is maintained by the pick and place device 80 on the package 40 pressing it into electrical contact with the contacts 37 on the silicon contact structure 30. It should be apparent that for simplicity, only one pick and place device 80 is illustrated. In actual practice, two such devices moving in tandem would be used with each of the holding fixtures 16 associated with the base 12 for the two-at-a-time DUT test assembly shown in the drawings.

By placing each package 40 properly within an opening 18 on a respective one of the contact structures 30, the contacts 43 electrically connect with the contacts 37. Further, the traces 39 from the contacts 37 to the pads 38 allow for the electrical connection to continue to the printed circuit board substrate 20 through the wire bonds 36 to the connections 27, and from there through the pins 60 extending through the block 70 to a testing device 90 (FIG. 1).

Through this arrangement, testing of the package 40 can be accomplished without using pogo or other pins to directly contact the DUT package 40.

Although the present invention has been described in terms of testing a chip-sized package 40, it is to be understood that the invention is not so limited. Specifically, all types of semiconductor devices which require testing may be utilized with the present invention.

The various conductors of the silicon contact structure 30 must be sufficiently conductive to function as an electrical intermediary between the circuit board 20 and the package 40. Preferably, the resistance across the conductors of the silicon contact structure 30 is between about 50 milliohms and five ohms.

The conductors on the silicon contact structure 30 may be formed as a metallized wiring pattern on a silicon substrate or as a pattern of doped polysilicon terminating in a metallized contact pad utilizing conventional integrated circuit conductor fabrication techniques.

The holding fixture 16 is removable from base 12 to allow removal and/or replacement of the silicon contact structure 30 and the PCB 20. Silicon contact structures 30 are simple and inexpensive to manufacture. Accordingly, if any damage or wear occurs to it during use, it is easily and inexpensively replaced.

Figure 11:
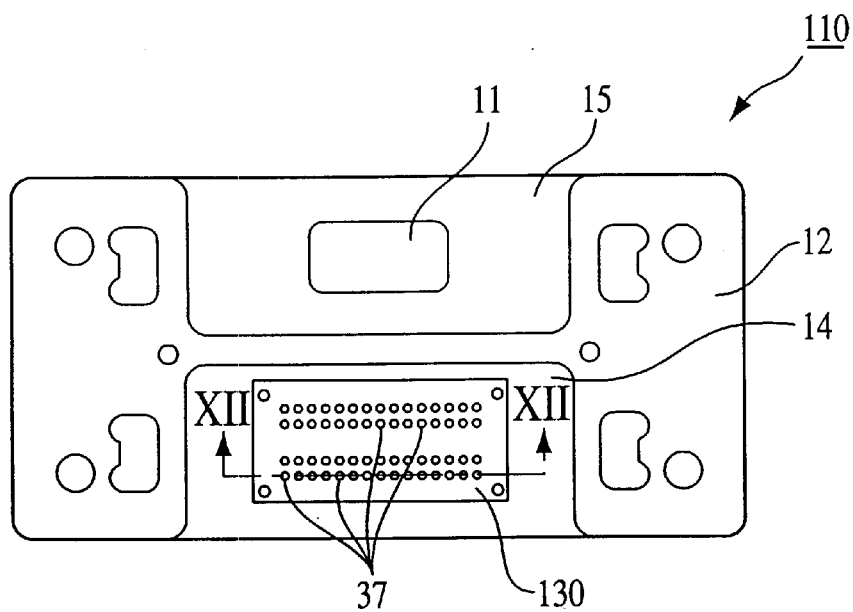
FIG. 11 is a top view of a test head assembly constructed in accordance with another embodiment of the invention.
Figure 12:
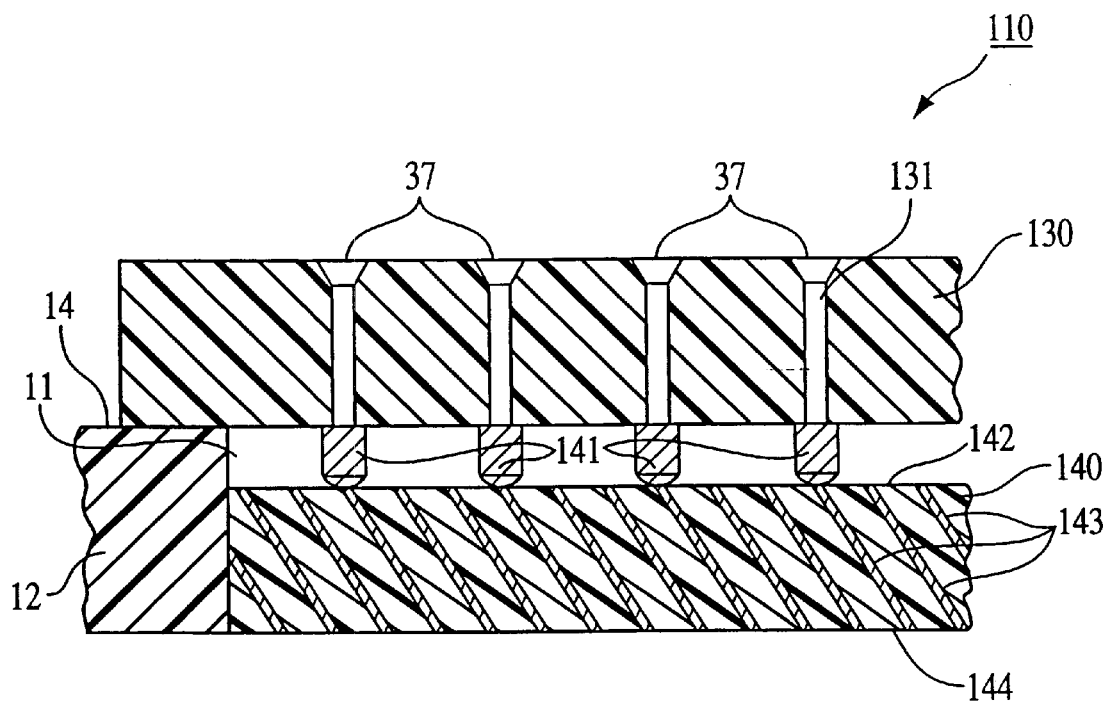
FIG. 12 is a partial cross-sectional view taken along line XII—XII of the assembly of FIG. 1.

Referring now to FIGS. 11–12, there is shown a test head assembly 110 which is similar in construction to the assembly 10 previously described, except that the pin blocks 70, 50 and pins 60 are replaced with an alternative structure (described in detail below). A silicon contact structure 130 is positioned within the cavity 14 of the assembly 110. The structure 130 differs from the silicon contact structure 30 in that the structure 130 does not connect with a PCB 20. Instead, the contacts 37 connect by way of conductive vias 131 with an interposing structure 140. Specifically, each via 131 contacts a respective contact element 141, which in turns contacts a first surface 142 of the interposing structure 140.

The interposing structure 140 is also preferably formed of silicone (or an electrically non-conductive elastomer), is sized and shaped to snugly fit within the cavity 11, and has electrically conductive, preferably gold or aluminum, wires 143 embedded within the structure 140. A second surface 144 of the structure 140 is the exit surface for the wires 143. The wires 143 serve to electrically connect the contact elements 141 with a respective contact pad on a testing device. The wires 143 may terminate in a bump-like contact, e.g., solder balls, at the surface 144 of the interposing structure 140.

The electrical contacts 37 are spaced to align with the contacts 43 of the DUT 40. Bypassing the PCB 20 in the testing of the DUT 40 decreases time delays and decreases the amount of inductance and/or capacitance in the testing arrangement. Further, bypassing the PCB 20 provides manufacturing advantages since the silicon contact structure 130 need not be processed to align with and electrically connect with the PCB 20.

Figure 13:
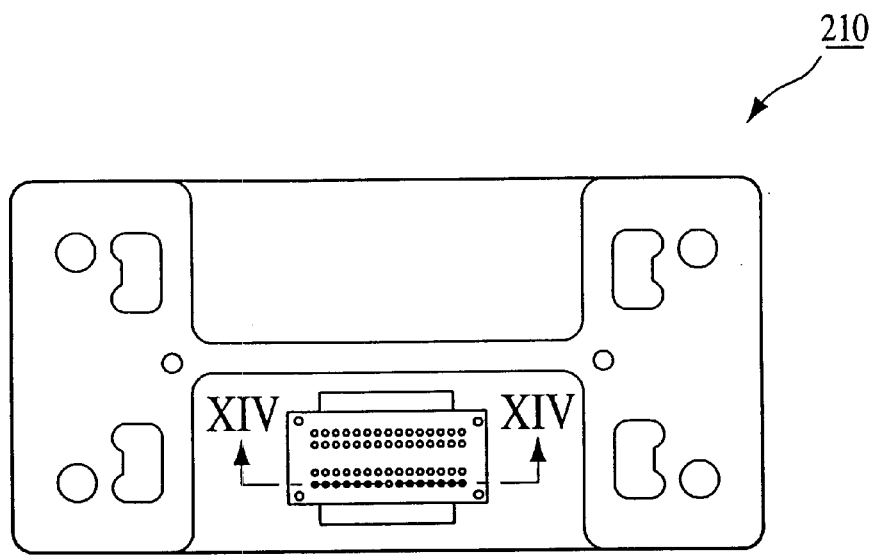
FIG. 13 is a top view of a test head assembly constructed in accordance with another embodiment of the invention.
Figure 14:
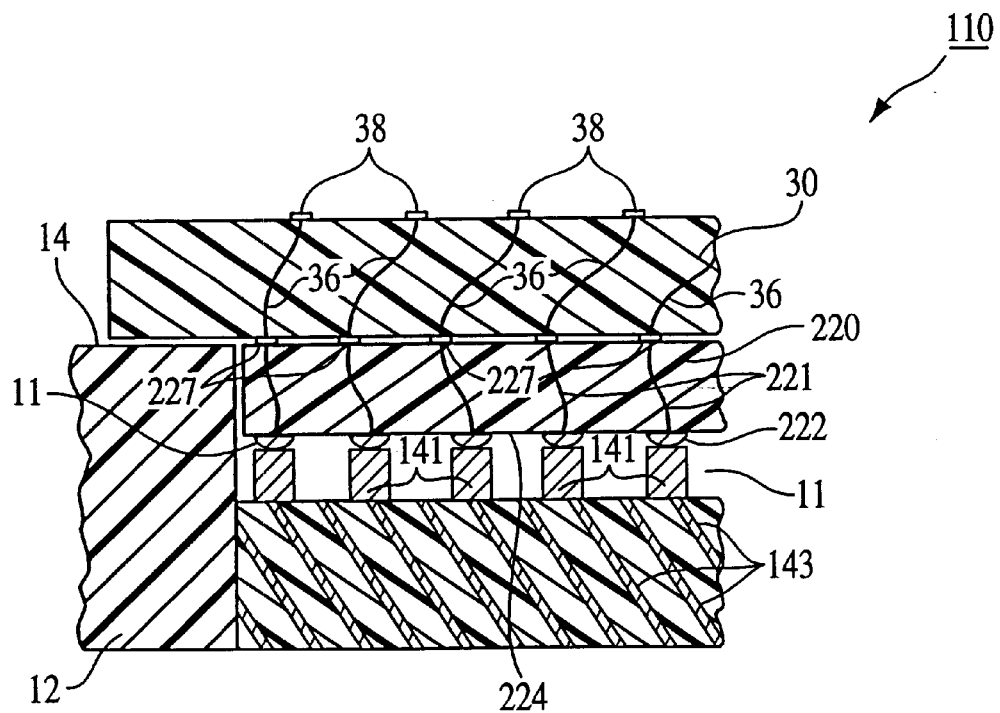
FIG. 14 is a partial cross-sectional view taken along line XIV—XIV of the assembly of FIG. 13.

Referring to FIGS. 13–14, another test head assembly 210 is illustrated. The assembly 210 differs from the assembly 110 in that a PCB 220 is included within the test arrangement. Specifically, the silicon contact structure 30 has pads 38 electrically connected by wires 36 to respective electrical connections 27 on the PUB 220.

The PCB 220 includes a plurality of solder balls, or other suitable contacting structure, 222 on a second surface 224. Each solder ball 222 is connected with a respective connection 227 by a wire bond 221, and connects with a respective contact element 141 of the interposing structure 140. The wires 143 electrically connect each contact element 141 with a respective contact pad of a testing device.

Figure 15:
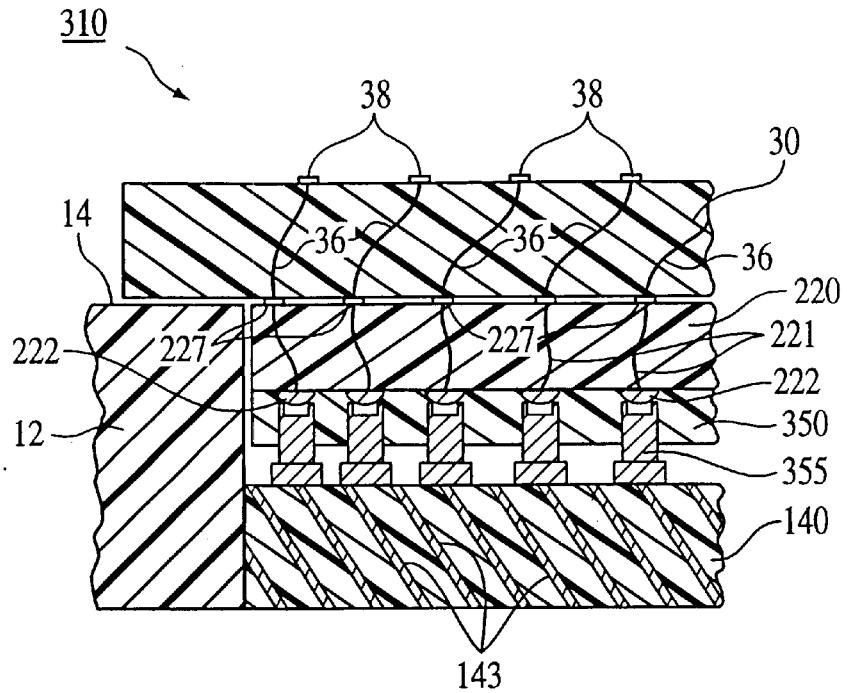
FIG. 15 is a cross-sectional view of a test head assembly constructed in accordance with another embodiment of the invention.
Figure 16:
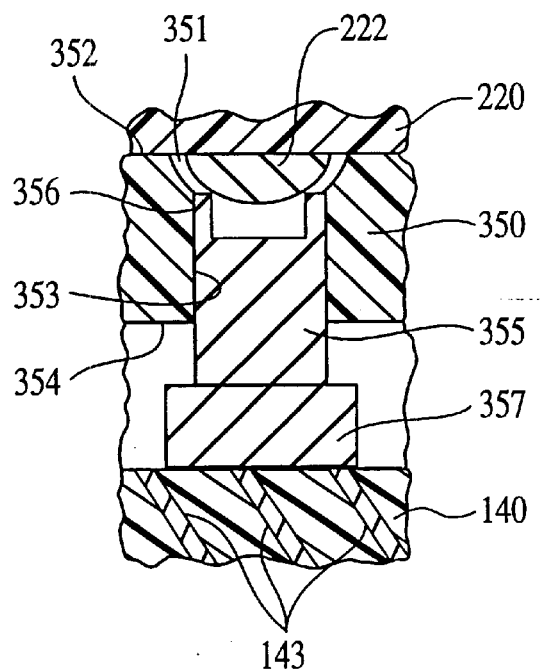
FIG. 16 is a cross-sectional view of a portion of the assembly of FIG. 15.

Another test head assembly 310 is illustrated in FIGS. 15–16. The assembly 310 includes the silicon contact structure 30 electrically connected with the PCB 220. Positioned directly beneath the surface 224 of the PCB 220 is a guide plate 350. The plate 350 has a plurality of pockets 351 within a first surface 352. The pockets 351 lead to vias 353 which extend to a second surface 354. A contact structure 355 fits within each via and pierces each solder ball 222 provided for the bottom surface contacts of the PCB 220, with a flange 356, to obtain a good electrical connection between the solder balls 222 provided on the lower surface of the silicon contact structure 330 and/or the PCB 220 connected thereto and the contact structures 355. With specific reference to FIG. 16, the structures 355 further each electrically connect, at an end 357, with the wires 243 of an interposing structure 340. The wires 143 each connect with a respective contact pad in a test device.

Alternatively, it is to be understood that the PCB 220 may be eliminated from the testing arrangement illustrated in FIGS. 15–16. By eliminating the PCB 220, the structure 30 can be flipped, and the contacts 38 electrically connected through the structures 355 to the wires 243. Elimination of the PCB 220 provides decreases inductance and capacitance in the system and decreases time delays in the testing. Further, the contact structure 130 shown in and described in reference with FIGS. 11–12 may be used instead of structure 30.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor device testing apparatus comprising:
   a base having two cavities;
   a pair of replaceable intermediate structures supported by said base, each having a first plurality of electrical contacts for connection with a respective device to be tested and a second plurality of electrical contacts, respectively connected with said first plurality of contacts, each said intermediate structure comprising a silicon substrate; and
   a pair of fixing structures for holding said intermediate structures to said base, each said fixing structure having an opening through which each respective device to be tested may pass and be connected with said second plurality of electrical contacts of one of said intermediate structures, wherein each cavity is sized and configured to receive one said fixing structure.

2. The apparatus of claim 1, wherein each of said first electrical contacts is a respective contact pad on one of said intermediate structures, each said contact pad being further electrically connected to a respective one of said second electrical contacts.

3. The apparatus of claim 2, further comprising a pick and place device for placing a respective said device to be tested in one of said fixing structure openings and in electrical contact with said first plurality of electrical contacts on said intermediate structure.

4. The apparatus of claim 1, further comprising a pair of pick and place devices for moving two respective said devices to be tested into respective said fixing structure openings for testing.

5. The apparatus of claim 1, wherein said fixing structures are replaceable.

6. The apparatus of claim 5, wherein said fixing structures are formed of a non-conductive material.

7. The apparatus of claim 6, wherein said fixing structures are formed of a glass-filled plastic.

8. The apparatus of claim 1, further comprising a pair of interposing structures having a plurality of first contacts, wherein said second contacts of each said intermediate structure electrically connect with respective said interposing structure first contacts.

9. The apparatus of claim 8, wherein said interposing structures further comprise a plurality of second contacts, each said interposing structure first and second contacts being electrically connected together by a respective conductor structure fabricated on or in each said interposing structure.

10. The apparatus of claim 9, wherein each said conductor structure is fabricated of a metallic material.

11. The apparatus of claim 10, wherein each said conductor structure is fabricated of gold.

12. The apparatus of claim 11, wherein each said conductor structure comprises a plurality of gold wires.

13. The apparatus of claim 11, wherein each said conductor structure is fabricated of aluminum.

14. The apparatus of claim 13, wherein said conductor structure comprises a plurality of aluminum wires.

15. The apparatus of claim 1, wherein each said intermediate structure first contact is connected to a respective said intermediate structure second contact through a conductive via.

16. A system for testing semiconductor devices, comprising:
   a testing apparatus comprising:
      a base having at least one cavity with an opening extending from a cavity surface to a bottom surface of said base;
      an intermediate structure supported by said base within one of said cavities and having a first plurality of electrical contacts for connection with a device to be tested and a second plurality of electrical contacts, respectively connected with said first plurality of contacts, said second plurality of electrical contacts being electrically accessible through said opening; and
      a fixing structure which holds said intermediate structure to said base, said fixing structure having an opening through which a device to be tested may pass and be connected with said second plurality of electrical contacts of said intermediate structure; and
   a pick and place device for moving the device to be tested into electrical connection with said first plurality of electrical contacts of said intermediate structure.

17. The system of claim 16, wherein said pick and place device comprises a vacuum head and a vacuum quill.

18. The system of claim 16, wherein said base has two cavities.

19. The system of claim 16, wherein said fixing structure is replaceable.

20. The system of claim 19, wherein said fixing structure is formed of a non-conductive material.

21. The system of claim 20, wherein said fixing structure is formed of a glass-filled plastic.

22. The system of claim 16, wherein said intermediate structure is replaceable.

* * * * *

UNITED STATES PATENT AND TRADEMARK OFFICE
CERTIFICATE OF CORRECTION

PATENT NO. : 6,459,286 B2 Page 1 of 1
DATED : October 1, 2002
INVENTOR(S) : David R. Hembree It is certified that error appears in the above-identified patent and that said Letters Patent is hereby corrected as shown below:

<u>Title page,</u>
Item [56], References Cited, U.S. PATENT DOCUMENTS, add
-- 6,246,246 B1 * 6/2001 Hembree 324/754 --
Item [57], ABSTRACT,
Line 7, change "future" to -- fixture --.

Signed and Sealed this

Eighteenth Day of March, 2003

JAMES E. ROGAN
*Director of the United States Patent and Trademark Office*